United States Patent
Abe et al.

(10) Patent No.: US 6,614,282 B2
(45) Date of Patent: Sep. 2, 2003

(54) CLAMP CIRCUIT FOR A SEMICONDUCTOR INTEGRATED CIRCUIT DEVICE

(75) Inventors: Hirofumi Abe, Gamagoori (JP); Hiroshi Fujii, Nukata-gun (JP); Sinichi Noda, Okazaki (JP); Hideaki Ishihara, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/270,808

(22) Filed: Oct. 14, 2002

(65) Prior Publication Data

US 2003/0071672 A1 Apr. 17, 2003

(30) Foreign Application Priority Data

Oct. 15, 2001 (JP) ........................ 2001-316753

(51) Int. Cl.[7] .................................................. H03K 5/08
(52) U.S. Cl. ...................................................... 327/321
(58) Field of Search ............................ 327/52, 89, 309, 327/310, 312–323, 333; 361/90, 91.1

(56) References Cited

U.S. PATENT DOCUMENTS

| | | | |
|---|---|---|---|
| 4,849,654 A | | 7/1989 | Okada |
| 5,065,056 A | * | 11/1991 | Imai et al. .................. 327/323 |
| 5,206,553 A | * | 4/1993 | Imai et al. .................. 327/321 |
| 5,479,119 A | | 12/1995 | Tice et al. .................... 327/74 |
| 5,500,617 A | * | 3/1996 | Tsugita ....................... 327/321 |
| 5,809,102 A | | 9/1998 | Nakashiba .................... 377/61 |
| 5,926,383 A | * | 7/1999 | Pilukaitis et al. ............. 363/50 |
| 6,034,854 A | | 3/2000 | Suga ........................... 361/56 |
| 6,388,516 B1 | * | 5/2002 | Doran et al. .................. 330/99 |
| 6,487,097 B2 | * | 11/2002 | Popescu .................. 363/56.09 |

FOREIGN PATENT DOCUMENTS

| | | |
|---|---|---|
| JP | 57-124464 | 8/1982 |
| JP | 61-24268 | 2/1986 |
| JP | 63-233560 | 9/1988 |
| JP | 4-347922 | 12/1992 |
| JP | 8-172162 | 7/1996 |
| JP | 9-129856 | 5/1997 |
| JP | 9-510790 | 10/1997 |
| JP | 10-98154 | 4/1998 |
| JP | 10-242391 | 9/1998 |
| JP | 2001-86641 | 3/2001 |

\* cited by examiner

*Primary Examiner*—My-Trang Nuton
(74) *Attorney, Agent, or Firm*—Harness, Dickey & Pierce PLC

(57) ABSTRACT

A comparator, having an offset of 0.1V, compares a terminal voltage Vin1 with a clamp voltage $V_{CL}$ (5.1V). When an overvoltage input exceeding the $V_{CL}$ is entered to an input terminal, the comparator turns on a transistor Q11. The current flows across an externally provided resistor R11, the input terminal, and the transistor Q11, and flows into an output terminal of an operational amplifier. With a voltage drop at the resistor R11, the terminal voltage Vin1 starts decreasing toward an output voltage Vc of the operational amplifier.

10 Claims, 8 Drawing Sheets

CLAMP CIRCUIT FOR A SEMICONDUCTOR INTEGRATED CIRCUIT DEVICE

BACKGROUND OF THE INVENTION

The present invention relates to a clamp circuit preferably used for protecting a signal input terminal of a semiconductor integrated circuit device.

For example, a semiconductor integrated circuit device incorporating an A/D converter has input terminals into which analog voltage signals are entered as detection result from various detectors.

FIG. 4 shows a clamp circuit employable for this kind of semiconductor integrated circuit device to prevent an overvoltage (i.e., excessive voltage) exceeding a withstand voltage from entering into this IC device.

A clamp circuit 1 shown in FIG. 4 includes resistors R1 and R2 provided in a signal input path 4 connected to an input terminal of a semiconductor integrated circuit device (i.e., IC) 2 incorporating an A/D converter. A zener diode ZD1 is connected between a joint point of two resistors R1 and R2 and a ground line 5. The zener diode ZD1 has a zener voltage Vz being set to be lower than a withstand voltage of IC 2. When an input voltage exceeds the zener voltage Vz, the zener diode ZD1 clamps the input voltage to the zener voltage Vz.

According to this arrangement, the resistors R1 and R2 and the zener diode ZD1 cooperatively constitute an external clamping hardware set required for each input terminal 3. When IC 2 has a plurality of input terminals 3, it is necessary to provide the same number of external clamping hardware sets. This will require an increased substrate surface area for mounting these external clamping hardware sets and accordingly the fabrication or manufacturing costs will increase.

Furthermore, U.S. Pat. No. 5,479,119 discloses an overvoltage protection circuit capable of protecting a sensitive circuit element (e.g., A/D converter) against saturation and damage when subjected to an excessive voltage. FIG. 5 shows a circuit arrangement of this overvoltage protection circuit. An overvoltage protection circuit 6 shown in FIG. 5 includes an out-of-range detector 7 which compares an input signal with reference levels to determine if it is within a predetermined range of acceptable inputs, a supplemental signal source 8 which generates a supplemental signal within a predetermined range, and a control circuit 10 which supplies the supplemental signal to an A/D converter 9 when the input signal is determined not to be within the predetermined range.

The overvoltage protection circuit 6 shown in FIG. 5 is characterized in that no clamping is applied to an input overvoltage signal and, instead, the input overvoltage signal is substituted by the supplemental signal to be entered into the A/D converter 9, thereby protecting the sensitive circuit element. According to this arrangement, the input overvoltage signal is directly entered into the out-of-range detector 7. This makes it difficult to form the out-of-range detector 7 and the A/D converter 9 on the same chip, when the IC uses CMOS processes or comparable low withstand processes.

SUMMARY OF THE INVENTION

In view of the above-described problems of the prior art, the present invention has an object to provide a clamp circuit preferably applicable to a signal input terminal of a semiconductor integrated circuit to reduce the number of external clamping circuit elements required for the clamping circuit.

In order to accomplish the above and other related objects, the present invention provides a clamp circuit including a comparing circuit for comparing a voltage of a signal input terminal with a predetermined clamp voltage and generating a clamp action command signal when the voltage of the signal input terminal exceeds the predetermined clamp voltage. A voltage output circuit, having a predetermined current output property, is provided for generating a voltage within a predetermined range not exceeding the clamp voltage. A switching circuit is connected between the signal input terminal and the voltage output circuit for performing a closing operation in response to the clamp action command signal generated from the comparing circuit. A semiconductor integrated circuit device incorporates or accommodates the comparing circuit, the voltage output circuit, and the switching circuit. A signal input path is provided outside the semiconductor integrated circuit device and is connected to the signal input terminal. A current limiting element is provided in this signal input path.

According to this arrangement, the comparing circuit compares the voltage of the signal input terminal (hereinafter, referred to as terminal voltage) with the predetermined clamp voltage. The switching circuit, connected between the signal input terminal and the voltage output circuit, performs a switching operation based on the clamp action command signal representing the comparison result. Regarding the clamp action at an upper limit side, the switching circuit is switched into an opened condition when the terminal voltage is not larger than the clamp voltage. An input voltage incoming from the outside enters via the current limiting element into the signal input terminal. Then, the input voltage is supplied to an internal circuit accommodated in the semiconductor integrated circuit device. In general, the input impedance of the internal circuit is so high that substantially no voltage error is caused by the current limiting element provided in the signal input path.

On the other hand, when the terminal voltage exceeds the clamp voltage, the switching circuit is switched into a closed condition. Current flows across the current limiting element provided in the signal input path, the signal input terminal of the semiconductor integrated circuit device, and the switching circuit. Then, the current enters into the voltage output circuit. This current causes a voltage drop at the current limiting element. The terminal voltage approaches to an output voltage of the voltage output circuit which is set at a level not exceeding the clamp voltage. When the terminal voltage becomes equal to or smaller than the clamp voltage, the switching circuit turns into the opened condition. In other words, only the limited duration that the incoming signal exceeds the clamp voltage, the comparing circuit controls the switching operation of the switching circuit based on the comparison between the terminal voltage and the clamp voltage so as to clamp the terminal voltage to an upper limit value of the clamp voltage.

Similarly, the above-described explanation is applied to the clamp action at a lower limit side. Namely, when the terminal voltage exceeds the clamp voltage in the negative direction, the switching circuit is switched into the closed condition. Current flows from the voltage output circuit across the switching circuit, the signal input terminal, and the external current limiting element.

Accordingly, the present invention makes it possible to clamp the terminal voltage to a desirable clamp voltage when an incoming signal is an overvoltage input exceeding the clamp voltage. Setting the clamp voltage to an appropriate value within a withstand voltage of the semiconductor integrated circuit device makes it possible to surely protect the semiconductor integrated circuit device against such an overvoltage input. The clamp circuit of the present invention requires only the current limiting element as the external element provided outside the semiconductor integrated circuit device. This is effective to reduce the substrate surface area required for mounting the external clamping circuit elements. The fabrication or manufacturing costs can be reduced.

Preferably, the comparing circuit includes a comparator which operates in response to a predetermined power source voltage supplied from a power source line and has one input terminal connected to the signal input terminal and the other input terminal connected to the power source line. In this comparator, transistors constituting an active load circuit in a differential amplifying circuit have a current output property ratio being set based on a difference between the clamp voltage and the power source voltage.

According to this arrangement, the comparator possesses an offset voltage corresponding to the current output property ratio of the transistors constituting an active load circuit. When one input terminal of the comparator is connected to the signal input terminal and the other input terminal is connected to the power source line, the terminal voltage is compared with a voltage (equivalent to the clamp voltage) being shifted from the power source line voltage by the offset voltage. Accordingly, there is no necessity of providing a clamp voltage generating circuit for generating a clamp voltage. The circuit arrangement can be simplified.

It is also preferable that the comparing circuit, the switching circuit and the current limiting element are provided for each signal input terminal when the semiconductor integrated circuit device has a plurality of signal input terminals, and the voltage output circuit is commonly provided for the plurality of signal input terminals.

According to this arrangement, as the voltage output circuit is commonly used for the plurality of signal input terminals, it becomes possible to reduce overall electric power consumption at the voltage output circuit.

It is also preferable that the comparing circuit, the current limiting element is a resistor.

This is effective to reduce a substrate surface area required for mounting the external clamping circuit elements. The fabrication or manufacturing costs can be reduced.

It is also preferable that the voltage output circuit has a current output property at least equivalent to $|Vm-V_{CL}|/R \times N$, where Vm represents a maximum voltage of a signal having not passed the resistor, $V_{CL}$ represents the clamp voltage, R represents a resistance value of the resistor, and N represents the total number of signal input terminals.

According to this arrangement, when the maximum voltage Vm is simultaneously applied to the total of N signal input terminals, the voltage output circuit can supply the current flowing across each switching circuit so as to surely clamp the terminal voltage to the clamp voltage.

It is also preferable that the signal input terminal is an analog signal input terminal connected to an A/D converter provided in the semiconductor integrated circuit device.

According to this arrangement, the terminal voltage is fixed to the clamp voltage when the incoming signal is an overvoltage input exceeding the clamp voltage.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF THE PREFERRED EMBODIMENTS

Figure 1:
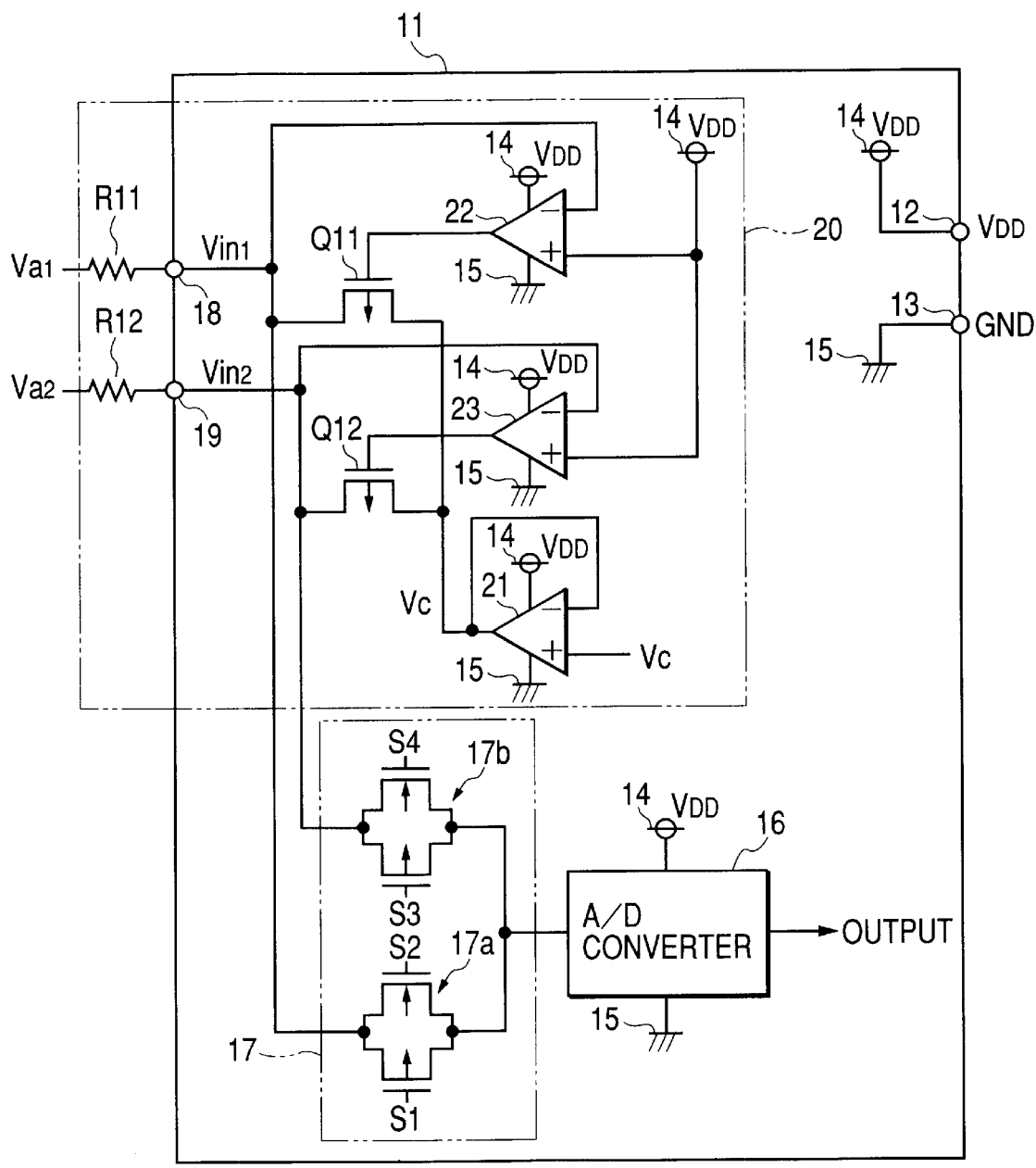
FIG. 1 is a circuit diagram showing the arrangement of a semiconductor integrated circuit device in accordance with a first embodiment of the present invention.

Preferred embodiments of the present invention will be explained hereinafter with reference to attached drawings. Identical parts are denoted by the same reference numerals throughout the drawings.

First Embodiment

A clamp circuit in accordance with a first embodiment of the present invention will be explained with reference to FIGS. 1 and 2.

FIG. 1 shows a semiconductor integrated circuit device 11 having a positive overvoltage protection function. The semiconductor integrated circuit device 11 is a product manufactured by CMOS processes. The semiconductor integrated circuit device 11 operates in response to electric power supplied from an external electric power source voltage $V_{DD}$ (e.g., 5.0V) via a power source terminal 12 ($V_{DD}$) and a ground terminal 13 (GND). The power source terminal 12 is connected to a high-voltage power source line 14 in the semiconductor integrated circuit device 11. The power source terminal 13 is connected to a low-voltage power source line (e.g., ground line) 15 in the semiconductor integrated circuit device 11.

The semiconductor integrated circuit device 11 includes an A/D converter 16, a multiplexer 17, and other various analog digital circuits (not shown). When the power source voltage $V_{DD}$ is 5.0V, first and second analog signal input terminals 18 and 19 have the maximum rated voltage of 5.5V. Each of the first and second analog signal input terminals 18 and 19 serves as a signal input terminal of the present invention. A clamp circuit 20, associated with this semiconductor integrated circuit device 11, prevents an overvoltage input exceeding a predetermined clamp voltage $V_{CL}$ (e.g., 5.1V) from being entered into the first and second signal input terminals 18 and 19. The semiconductor integrated circuit device 11 is used in an electronic control unit (ECU) installed in an automotive vehicle.

The multiplexer 17 includes a pair of analog switches 17a and 17b arranged in parallel with each other, in which the first analog switch 17a interposes between the first signal input terminal 18 and an input terminal of A/D converter 16. The second analog switch 17b interposes between the second signal input terminal 19 and the input terminal of A/D converter 16. Only one of the first and second analog switches 17a and 17b turns on in response to select signals S1 to S4. The A/D converter 16 executes an A/D conversion with a predetermined resolution for processing voltages within the range from 0.0V to 5.0V entered from the multiplexer 17.

A majority of circuit components constituting the clamp circuit 20 are provided inside the semiconductor integrated circuit device 11. Only two, first and second, resistors R11 and R12 of the clamp circuit 20 are provided outside the semiconductor integrated circuit device 11, for example, on a substrate surface other than the semiconductor integrated circuit device 11. The first resistor R11 has one end connected to the first signal input terminal 18 and the other terminal connected to a detecting device (not shown) generating an analog voltage Va1. The second resistor R12 has one end connected to the second signal input terminal 19 and the other terminal connected to a detecting device (not shown) generating an analog voltage Va2. Namely, the resistors R11 and R12 are provided in the signal input paths extending from the signal input terminals 18 and 19 out of the semiconductor integrated circuit device 11.

In the semiconductor integrated circuit device 11, a first P-channel transistor Q11 interposes between the first signal input terminal 18 and an output terminal of an operational amplifier 21. A second P-channel transistor Q12 interposes between the second signal input terminal 19 and the output terminal of the operational amplifier 21. The operational amplifier 21 serves as a voltage output circuit of the present invention. Each of the first and second P-channel transistors Q11 and Q12 serves as a switching circuit. Namely, the source and the drain of respective transistors Q11 and Q12 are connected to the signal input terminals 18 and 19 and the operational amplifier 21. The operational amplifier 21 has a voltage follower arrangement which directly outputs a constant voltage Vc entered from a constant voltage generating circuit (not shown). The constant voltage Vc is not larger than the clamp voltage $V_{CL}$. To assure a reliable clamp action, it is preferable to set the constant voltage Vc to be a value lower than the clamp voltage $V_{CL}$ by an amount equivalent to or more than the source-drain voltage $V_{DS}$ of respective transistors Q11 and Q12 in the ON state.

A first comparator 22 compares a voltage Vin1 of first signal input terminal 18 (hereinafter, referred to terminal voltage Vin1) with the clamp voltage $V_{CL}$. A second comparator 23 compares a voltage Vin2 of second signal input terminal 19 (hereinafter, referred to terminal voltage Vin2) with the clamp voltage $V_{CL}$. The first comparator 22 has a noninverting input terminal connected to the high-voltage power source line 14, an output terminal connected to the gate of first transistor Q11, and an inverting input terminal connected to the first signal input terminal 18. The second comparator 23 has a noninverting input terminal connected to the high-voltage power source line 14, an output terminal connected to the gate of second transistor Q12, and an inverting input terminal connected to the second signal input terminal 19. Each of the first and second comparators 22 and 23 serves as a comparing circuit of the present invention.

Figure 2:
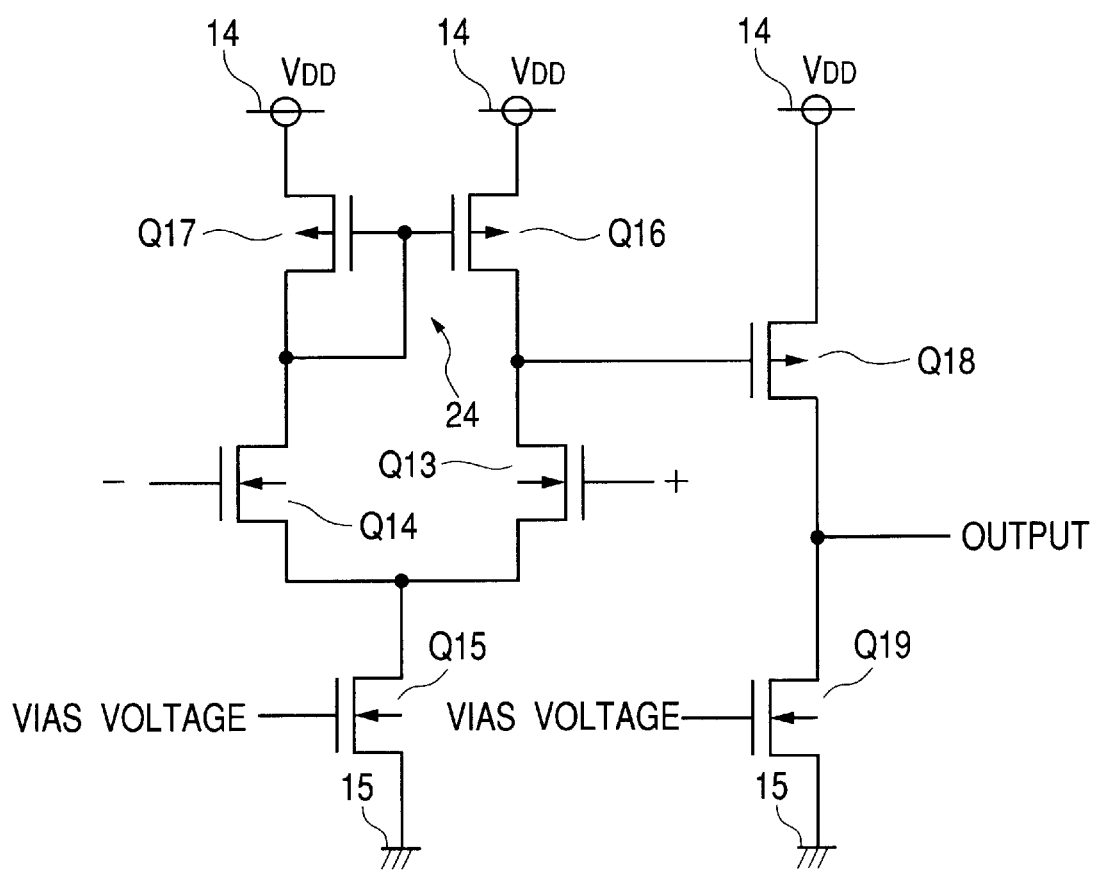
FIG. 2 is a circuit diagram showing the detailed arrangement of a comparator in accordance with the first embodiment of the present invention.

FIG. 2 shows a detailed circuit arrangement of each comparator (22, 23), according to which an N-channel transistor Q13 is disposed at the noninverting input terminal side and an N-channel transistor Q14 is disposed at the inverting input terminal side. The transistors Q13 and Q14, respectively serving as differential-input transistors, have a common source which is connected to the low-voltage power source line 15 via an N-channel transistor Q15. The transistor Q15 constitutes a constant current circuit. Furthermore; a P-channel transistor Q16 interposes between the drain of transistor Q13 and the high-voltage power source line 14, and a P-channel transistor Q17 interposes between the drain of transistor Q14 and the high-voltage power source line 14. The transistors Q16 and Q17, cooperatively constituting an active load circuit 24, have a common gate and are arranged into a current-mirror circuit. The gate area of transistor Q17 is 1.5 times the gate area of transistor Q16.

Furthermore, a P-channel transistor Q18 and an N-channel transistor Q19 are serially connected between the high-voltage power source line 14 and the low-voltage power source line 15. The transistors Q18 and Q19 have a common drain serving as an output node. The drain of transistor Q13 is connected to the gate of transistor Q18. A bias voltage is applied to each gate of respective transistors Q15 and Q19.

According to the above-described circuit arrangement, the current output property of the transistor Q17 is higher than that of the transistor Q16. This causes an offset voltage of 0.1V between the noninverting input terminal and the inverting input terminal. Thus, the clamp voltage $V_{CL}$ is given as 5.1V which is higher by 0.1V than the electric potential of the inverting input terminal (5.0V).

When the electric potential of the noninverting input terminal (i.e., terminal voltage Vin1, Vin2) exceeds 5.1V (i.e., clamp voltage $V_{CL}$), the output of the comparator turns from H-level (5V) to L-level (0V).

Next, the overvoltage protection function of the above-described clamp circuit according to the first embodiment will be explained. The following explanation of the overvoltage protection function is equally applied to each of the first and second signal input terminals 18 and 19 (associated with the comparators 22 and 23), although the first signal input terminal 18 and the comparator 22 are chiefly explained.

As described above, the comparator 22 possesses the offset voltage of 0.1V. Hence, the comparator 22 has a function of comparing the terminal voltage Vin1 with the clamp voltage $V_{CL}$ (5.1V). When the terminal voltage Vin1 is within a normal voltage range not exceeding the clamp voltage $V_{CL}$ (5.1V), the comparator 22 generates an H-level output. The transistor Q11 turns off in response to the H-level output of comparator 22, and separates the signal input terminal 18 from the operational amplifier 21. The analog voltage Va1 detected from a detector (not shown) enters into the A/D converter 16 via a route of the resistor R11, the input terminal 18, and the multiplexer 17. The A/D converter 16, being constituted by a MOS transistor, has an extremely high impedance. The terminal voltage Vin1 becomes equal to the analog voltage Va1. The presence of resistor R11 in the signal input path causes substantially no voltage error.

On the other hand, when the terminal voltage Vin1 is an overvoltage input exceeding the clamp voltage $V_{CL}$, the comparator 22 generates an L-level output (corresponding to a clamp action command signal). A sufficient gate voltage exceeding a threshold voltage Vt is applied between the gate and the source of the transistor Q11. Accordingly, the transistor Q11 surely turns into an ON state. In this case, the current flows across the resistor R11, the input terminal 18, and the transistor Q11 and enters into the output terminal of operational amplifier 21. As the on-resistance of the transistor Q11 is sufficiently smaller than that of the resistor R11, a significant voltage drop appears at the resistor R11 and the terminal voltage Vin1 starts decreasing toward the output voltage Vc of operational amplifier 21. And then, the transistor Q11 turns off when the terminal voltage Vin1 becomes equal to or smaller than the clamp voltage $V_{CL}$.

In this manner, only the limited duration that the detected analog voltage Va1 exceeds the clamp voltage $V_{CL}$ in the positive direction, the comparator 22 controls the on-and-off action of the transistor Q11 based on the comparison between the terminal voltage Vin1 and the clamp voltage $V_{CL}$. With this control, the terminal voltage Vin1 is clamped to the clamp voltage $V_{CL}$(5.1V).

In this case, the current output property (current sink property) Isink required for the operational amplifier 21 is expressed by the following formula (1).

$$Isink \geq (Va1max - V_{CL})/R11 + (Va2max - V_{CL})/R12 \qquad (1)$$

where Va1max represents a maximum value of the analog voltage Va1, Va2max represents a maximum value of the analog voltage Va2, R11 represents a resistance value of resistor R11, and R12 represents a resistance value of resistor R12.

The following formula (2) is a generalized form of the above-described formula (1), in which the maximum values of the analog voltages Va1, Va2 are replaced with Vam, Vax and each of the resistance values of resistors R11 and R12 is replaced with R, and N represents a total number of the signal input terminals.

$$Isink \geq (Vamax - V_{CL})/R \times N \qquad (2)$$

As described above, according to the first embodiment, the clamp circuit 20 is associated with the semiconductor integrated circuit device 11. When an incoming overvoltage input exceeding the clamp voltage $V_{CL}$ is entered to the signal input terminals 18 and 19 of the A/D converter 16, the clamp circuit 20 clamps the terminal voltages Vin1 and Vin2 to the clamp voltage $V_{CL}$. The clamp voltage $V_{CL}$ (5.1V) is set to be higher than the power source voltage $V_{DD}$ (5.0V) and lower than the maximum rated voltage of the signal input terminals 18 and 19. Thus, the A/D conversion is performed without deteriorating the accuracy for the input voltages within the range from 0.0V to 5.0V. It becomes possible to protect the semiconductor integrated circuit device 11 against the overvoltage input.

Of the electric components constituting the clamp circuit 20, the transistors Q11, Q12, the operational amplifier 21, and the comparators 22 and 23 are accommodated inside the semiconductor integrated circuit device 11. Only the resistors R11 and R12 are external elements provided outside the semiconductor integrated circuit device 11. Accordingly, it becomes possible to reduce the number of external components. The substrate surface area required for mounting the external clamping circuit elements can be reduced. The fabrication or manufacturing costs can be reduced. If the total number of the signal input terminals is increased, the above-described effects will be further enhanced.

In each of the comparators 22 and 23 of the clamp circuit 20, the current output property ratio between the transistors Q16 and Q17 is set or designed so as to provide the above-described offset voltage. Thus, it is not necessary to provide a reference voltage generating circuit for generating the clamp voltage $V_{CL}$. The operational amplifier 21 can be commonly used for the plurality of signal input terminals 18 and 19. This makes it possible to simplify the circuit arrangement and reduce the electric consumption.

When the terminal voltages Vin1 and Vin2 are within the normal voltage range not exceeding the clamp voltage $V_{CL}$, the transistors Q11 and Q12 are in OFF state so that the voltage applied to each of the resistors R11 and R12 becomes 0. Thus, the presence of clamp circuit 20 gives no adverse influence to the accuracy of A/D conversion. Furthermore, the conversion result during the overvoltage protecting operation for clamping the terminal voltages Vin1 and Vin2 becomes a value corresponding to the clamp voltage $V_{CL}$ (i.e., 5.1V). In practice, this value corresponds to the upper limit 5.0V of the input voltage range. Namely, during the overvoltage protecting operation in which the detected analog voltage Va1 or Va2 exceeds the input voltage range, surely obtaining the conversion result corresponding to the upper limit value of the input voltage range closest to the analog voltages Va1 and Va2 leads to a reliable signal processing.

As apparent from the foregoing description, the first embodiment of the present invention provides a clamp circuit (20) includes a comparing circuit (22, 23) for comparing a voltage (Vin1, Vin2) of a signal input terminal (18, 19) with a predetermined clamp voltage ($V_{CL}$) and for generating a clamp action command signal when the voltage (Vin1, Vin2) of the signal input terminal exceeds the predetermined clamp voltage ($V_{CL}$). A voltage output circuit (21), having a predetermined current output property, is provided for generating a voltage within a predetermined range not exceeding the clamp voltage ($V_{CL}$). A switching circuit (Q11, Q12), connected between the signal input terminal (18, 19) and the voltage output circuit (21), performs a closing operation in response to the clamp action command signal generated from the comparing circuit (22, 23). A semiconductor integrated circuit device (11) incorporates or accommodates the comparing circuit (22, 23), the voltage output circuit (21), and the switching circuit (Q11, Q12). A signal input path, provided outside the semiconductor integrated circuit device (11), is connected to the signal input terminal (18, 19). And, a current limiting element (R11, R12) is provided in this signal input path.

The comparing circuit includes a comparator (22, 23) which operates in response to a predetermined power source voltage ($V_{DD}$) supplied from a power source line (14) and has one input terminal connected to the signal input terminal (18, 19) and the other input terminal connected to the power source line (14). In each comparator (22, 23), the transistors (Q16, Q17) constituting an active load circuit (24) in a differential amplifying circuit have a current output property ratio being set based on a difference between the clamp voltage ($V_{CL}$) and the power source voltage ($V_{DD}$).

The comparing circuit (22, 23), the switching circuit (Q11, Q12) and the current limiting element (R11, R12) are provided for each signal input terminal when the semiconductor integrated circuit device has a plurality of signal input terminals (18, 19), and the voltage output circuit (21) is commonly provided for the plurality of signal input terminals (18, 19).

The current limiting element (R1, R12) is a resistor.

The voltage output circuit (21) has a current output property at least equivalent to $|Vm - V_{CL}|/R \times N$, where Vm represents a maximum voltage of a signal having not passed the resistor (R11, R12), $V_{CL}$ represents the clamp voltage, R represents a resistance value of the resistor (R11, R12), and N represents the total number of signal input terminals.

The signal input terminal is an analog signal input terminal connected to an A/D converter (16) provided in the semiconductor integrated circuit device (11).

Second Embodiment

Figure 3:
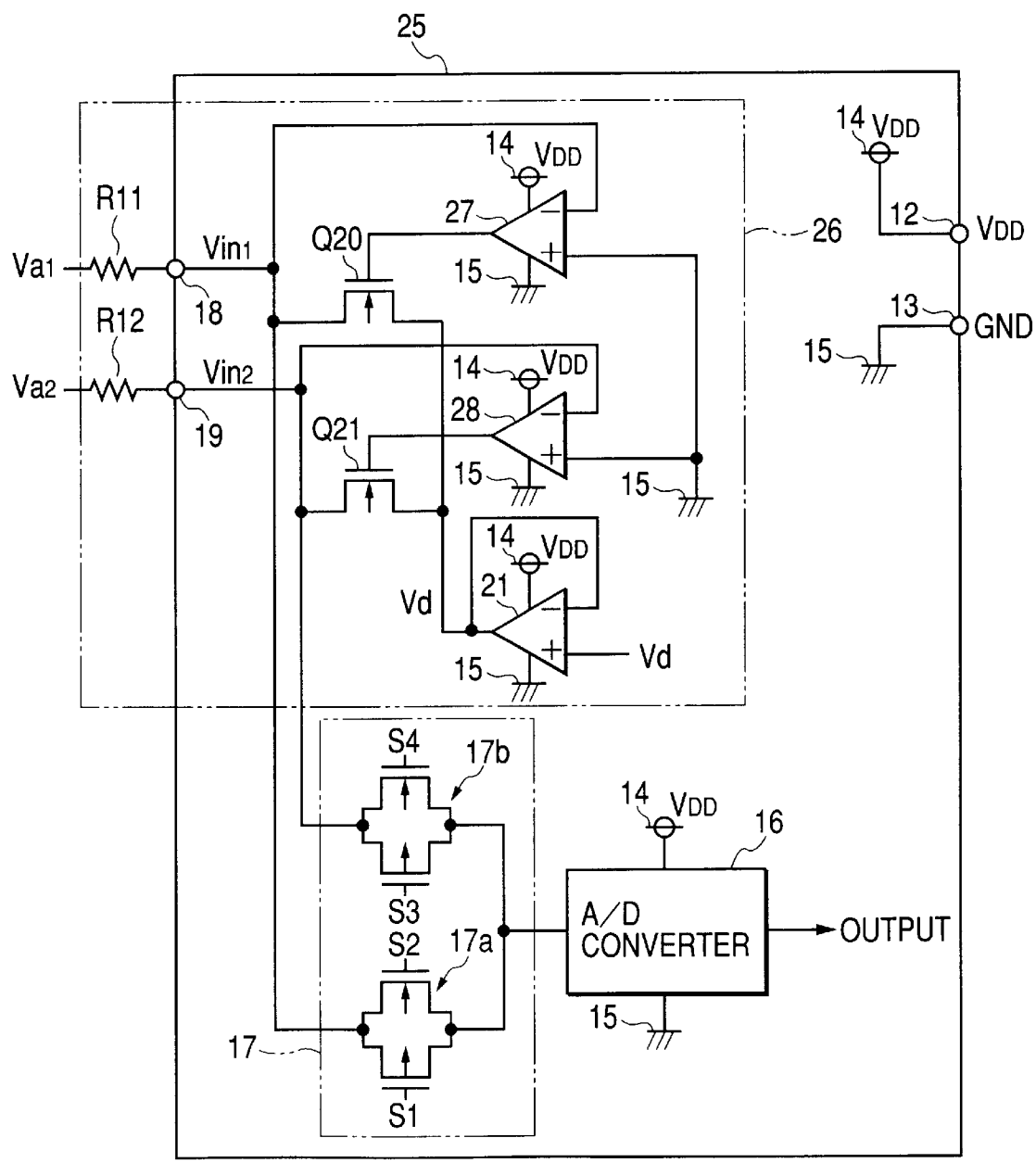
FIG. 3 is a circuit diagram showing the arrangement of a semiconductor integrated circuit device in accordance with a second embodiment of the present invention.
Figure 4:
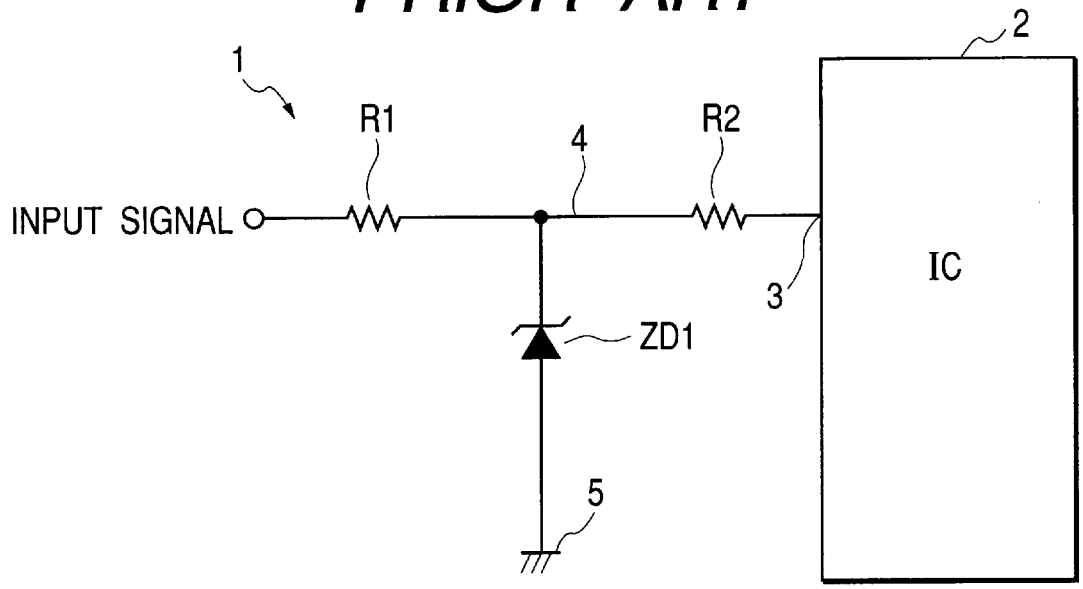
FIG. 4 is a circuit diagram showing the arrangement of a conventional clamp circuit.
Figure 5:
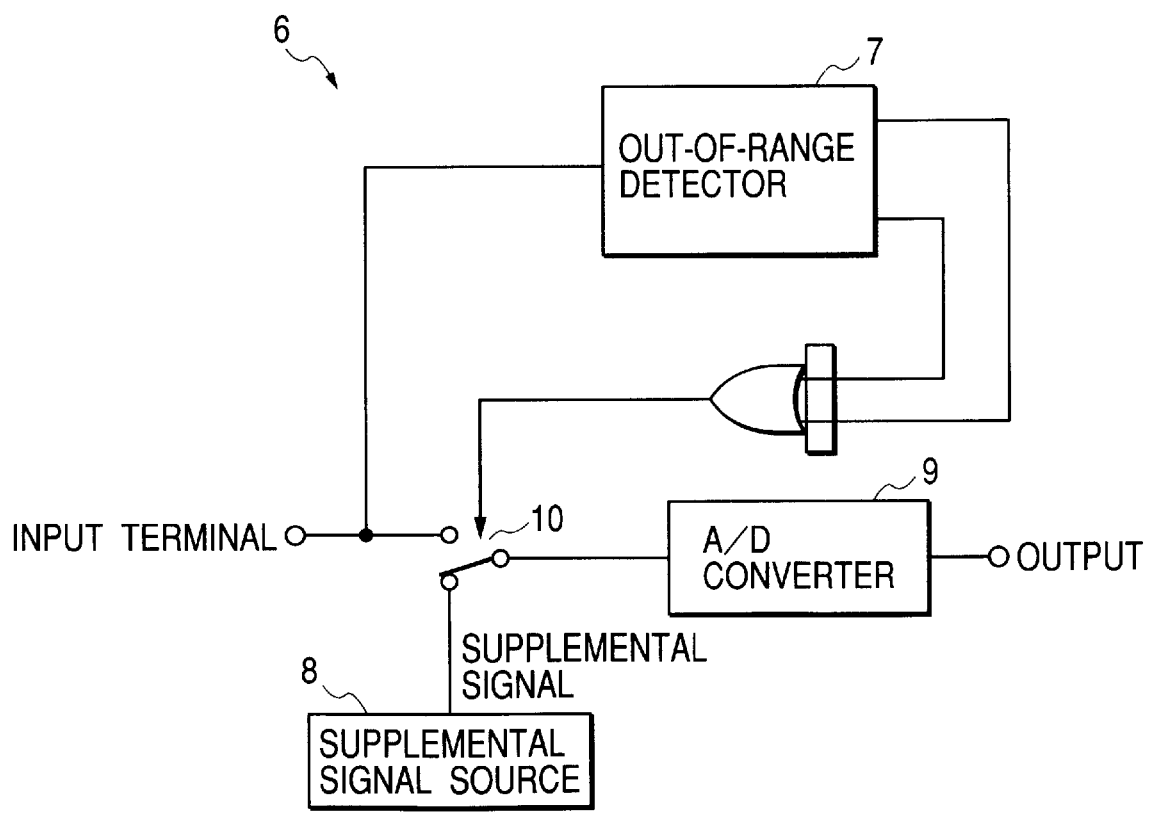
FIG. 5 is a circuit diagram showing the arrangement of a conventional overvoltage protection circuit.

A second embodiment of the present invention will be explained with reference to FIG. 3. FIG. 3 shows a semiconductor integrated circuit device 25 having a negative overvoltage protection function. The components identical with those disclosed in FIG. 1 are denoted by the same reference numerals. A clamp circuit 26 for the semiconductor integrated circuit device 25 is different from the clamp circuit 20 of the first embodiment in that the P-channel transistors Q11 and Q12 are replaced by N-channel transistors Q20 and Q21, respectively. The N-channel transistors Q20 and Q21 serve as the switching circuit of the present invention. Furthermore, the clamp circuit 26 is different from the clamp circuit 20 in that the noninverting input terminals of comparators 27 and 28 (serving as comparing circuits) are both connected to the low-voltage power source line 15.

Although not shown in the drawings, the comparators 27 and 28 are designed in such a manner that an active load circuit for differential-input transistors possesses a predetermined amount of unbalance so as to possess an offset voltage of 0.1V, as explained in the first embodiment. In this case, the clamp voltage $V_{CL}$ is given as −0.1V which is lower by 0.1V than the voltage of the noninverting input terminal (0.0V). When the electric potential of the inverting input terminal (i.e., terminal voltage Vin1, Vin2) decreases beyond −0.1V (i.e., clamp voltage $V_{CL}$), the output of the comparator (27, 28) turns from L-level (0V) to H-level (5V).

The operational amplifier 21 generates a constant voltage Vd. The voltage Vd is not smaller than the clamp voltage $V_{CL}$. To assure a reliable clamp action, it is preferable to set the constant voltage Vd to be a value higher than the clamp voltage $V_{CL}$ by an amount equivalent to or more than the drain-source voltage $V_{DS}$ of respective transistors Q20 and Q21 in the ON state.

Next, the overvoltage protection function of the above-described clamp circuit according to the second embodiment will be explained. The following explanation of the overvoltage protection function is equally applied to each of the first and second signal input terminals 18 and 19 (associated with the comparators 27 and 28), although the first signal input terminal 18 and the comparator 27 are chiefly explained.

As described above, the comparator 27 possesses the offset voltage of 0.1V. Hence, the comparator 27 has a function of comparing the terminal voltage Vin1 with the clamp voltage $V_{CL}$ (−0.1V). When the terminal voltage Vin1 is within a normal voltage range not exceeding the clamp voltage $V_{CL}$ (−0.1V) in the negative direction (i.e., Vin≧$V_{CL}$), the comparator 27 generates an L-level output. The transistor Q20 turns off in response to the L-level output of comparator 27, and separates the signal input terminal 18 from the operational amplifier 21. The analog voltage Va1 detected from a detector (not shown) enters into the A/D converter 16 via a route of the resistor R11, the input terminal 18, and the multiplexer 17. The A/D converter 16, being constituted by a MOS transistor, has an extremely high impedance. The terminal voltage Vin1 becomes equal to the analog voltage Va1. The presence of resistor R11 in the signal input path causes substantially no voltage error.

On the other hand, when the terminal voltage Vin1 is an overvoltage input exceeding the clamp voltage $V_{CL}$ in the negative direction (i.e., Vin<$V_{CL}$<0), the comparator 27 generates an H-level output (corresponding to a clamp action command signal). The transistor Q20 turns into the ON state in response to the H-level output of the comparator 27. The current flows from the output terminal of the operational amplifier 21 across the transistor Q20, the input terminal 18, and the resistor R11. As the on-resistance of the transistor Q20 is sufficiently smaller than that of the resistor R11, a significant voltage drop appears at the resistor R11 and the terminal voltage Vin1 starts increasing toward the output voltage Vd of operational amplifier 21. And then, the transistor Q20 turns off when the terminal voltage Vin1 becomes equal to or larger than the clamp voltage $V_{CL}$.

In this manner, only the limited duration that the detected analog voltage Va1 exceeds the clamp voltage $V_{CL}$ in the negative direction, the comparator 27 controls the on-and-off action of the transistor Q20 based on the comparison between the terminal voltage Vin1 and the clamp voltage $V_{CL}$. With this control, the terminal voltage Vin1 is clamped to the clamp voltage $V_{CL}$(−0.1V).

As described above, according to the second embodiment, the clamp circuit 26 is associated with the semiconductor integrated circuit device 25. When an incoming input exceeding the clamp voltage $V_{CL}$ in the negative direction is entered to the signal input terminals 18 and 19 of the A/D converter 16, the clamp circuit 26 clamps the terminal voltages Vin1 and Vin2 to the clamp voltage $V_{CL}$. The clamp voltage $V_{CL}$ (−0.1V) is set to be lower than the power source voltage GND (0V) and higher than the minimum rated voltage of the signal input terminals 18 and 19. Thus, the A/D conversion is performed without deteriorating the accuracy for the input voltages within the range from 0.0V to 5.0V. It becomes possible to protect the semiconductor integrated circuit device 26 against the overvoltage input.

Of the electric components constituting the clamp circuit 26, the transistors Q20, Q21, the operational amplifier 21, and the comparators 27 and 28 are accommodated inside the semiconductor integrated circuit device 25. Only the resistors R11 and R12 are external elements provided outside the semiconductor integrated circuit device 25. Accordingly, it becomes possible to reduce the number of external components. The substrate surface area required for mounting the external clamping circuit elements can be reduced. The fabrication or manufacturing costs can be reduced. If the total number of the signal input terminals is increased, the above-described effects will be further enhanced.

In each of the comparators 27 and 28 of the clamp circuit 26, the current output property ratio between the incorporated transistors is set or designed so as to provide the above-described offset voltage. Thus, it is not necessary to provide a reference voltage generating circuit for generating the clamp voltage $V_{CL}$. The operational amplifier 21 can be commonly used for the plurality of signal input terminals 18 and 19. This makes it possible to simplify the circuit arrangement and reduce the electric consumption.

When the terminal voltages Vin1 and Vin2 are within the normal voltage range not exceeding the clamp voltage $V_{CL}$ in the negative direction, the transistors Q20 and Q21 are in OFF state so that the voltage applied to each of the resistors R11 and R12 becomes 0. Thus, the presence of clamp circuit 26 gives no adverse influence to the accuracy of A/D conversion. Furthermore, the conversion result during the overvoltage protecting operation for clamping the terminal voltages Vin1 and Vin2 becomes a value corresponding to the clamp voltage $V_{CL}$ (i.e., −0.1V). In practice, this value corresponds to the lower limit 0.0V of the input voltage range. Namely, during the overvoltage protecting operation in which the detected analog voltage Va1 or Va2 exceeds the input voltage range in the negative direction, surely obtaining the conversion result corresponding to the lower limit value of the input voltage range closest to the analog voltages Va1 and Va2 leads to a reliable signal processing.

As apparent from the foregoing description, the second embodiment of the present invention provides a clamp circuit (26) including a comparing circuit (27, 28) for comparing a voltage (Vin1, Vin2) of a signal input terminal (18, 19) with a predetermined clamp voltage ($V_{CL}$) and for generating a clamp action command signal when the voltage (Vin1, Vin2) of the signal input terminal exceeds the predetermined clamp voltage ($V_{CL}$). A voltage output circuit (21), having a predetermined current output property, is provided for generating a voltage within a predetermined range not exceeding the clamp voltage ($V_{CL}$). A switching circuit (Q20, Q21), connected between the signal input terminal (18, 19) and the voltage output circuit (21), performs a closing operation in response to the clamp action command signal generated from the comparing circuit (27, 28). A semiconductor integrated circuit device (25) incorporates or accommodates the comparing circuit (27, 28), the voltage output circuit (21), and the switching circuit (Q20, Q21). A signal input path, provided outside the semiconductor integrated circuit device (25), is connected to the signal input terminal (18, 19). And, a current limiting element (R11, R12) is provided in this signal input path.

The comparing circuit includes a comparator (27, 28) which operates in response to a predetermined power source voltage ($V_{DD}$) supplied from a power source line (14) and has one input terminal connected to the signal input terminal (18, 19) and the other input terminal connected to the power source line (15). In each comparator (27, 28), the transistors (Q16, Q17) constituting an active load circuit (24) in a differential amplifying circuit have a current output property ratio being set based on a difference between the clamp voltage ($V_{CL}$) and the power source voltage ($V_{DD}$).

The comparing circuit (27, 28), the switching circuit (Q20, Q21) and the current limiting element (R11, R12) are provided for each signal input terminal when the semiconductor integrated circuit device has a plurality of signal input terminals (18, 19), and the voltage output circuit (21) is commonly provided for the plurality of signal input terminals (18, 19).

The current limiting element (R11, R12) is a resistor.

The voltage output circuit (21) has a current output property at least equivalent to $|Vm-V_{CL}|/R \times N$, where Vm represents a maximum voltage of a signal having not passed the resistor (R11, R12), $V_{CL}$ represents the clamp voltage, R represents a resistance value of the resistor (R11, R12), and N represents the total number of signal input terminals.

The signal input terminal is an analog signal input terminal connected to an A/D converter (16) provided in the semiconductor integrated circuit device (11).

Various Modifications

The present invention is not limited to the above-described first and second embodiments, and therefore the embodiments can be modified in various ways.

For example, it is preferable that both of the clamp circuit 20 of the first embodiment and the clamp circuit 26 of the second embodiment are provided for a single semiconductor integrated circuit device.

The overvoltage protection function of the clamp circuit according to the present invention is applicable not only to the analog input terminals but also to other various signal input terminals including digital versatile ports.

The total number of signal input terminals to be protected by the clamp circuit of this invention is not limited to two, and therefore can be reduced to only one or alternatively can be increased to three or more, although the operational amplifier 21 is commonly used for all of the signal input terminals.

According to the above-described first and second embodiments, the active load circuit for the comparators 22, 23, 27, and 28 is designed to have unbalance properties. Instead, it is preferable to set such unbalance properties to the differential-input transistors.

Furthermore, it is also preferable that the comparators have the offset voltage of 0 and a clamp voltage generating circuit is provided for generating the clamp voltage $V_{CL}$, in which the clamp voltage $V_{CL}$ is applied to the noninverting input terminal of each comparator.

It is also preferable that each of the semiconductor integrated circuit devices 11 and 25 is a product manufactured by bipolar processes.

Moreover, the operational amplifier 21 can be replaced by other equivalent element.

For example, regarding the semiconductor integrated circuit device 11 having a positive overvoltage protection function. The clamp circuit 20 of the first embodiment can be modified as shown in FIGS. 6 and 7.

Figure 6:
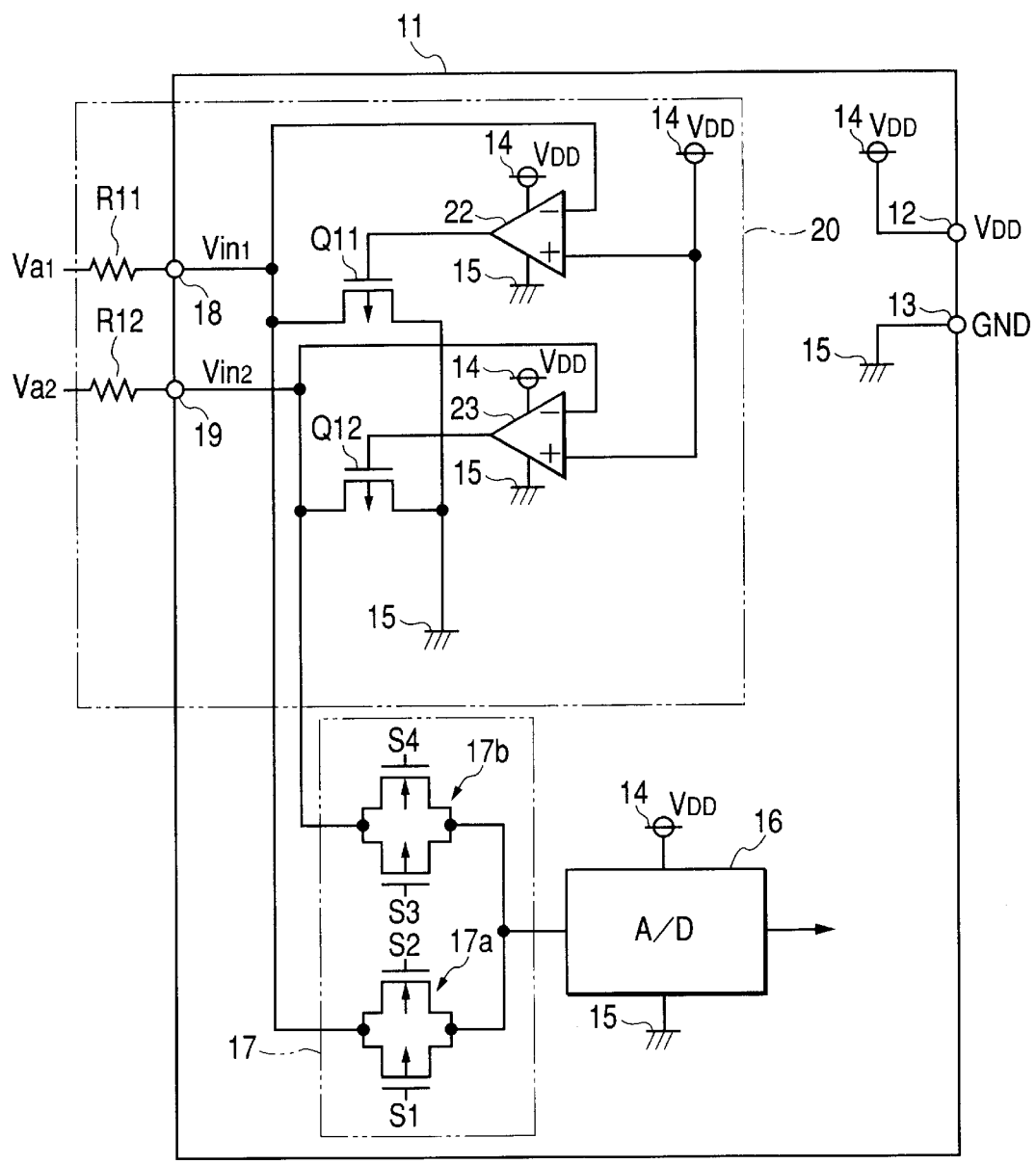
FIG. 6 is a circuit diagram showing the arrangement of a modified semiconductor integrated circuit device in accordance with the first embodiment of the present invention.

According to the circuit arrangement shown in FIG. 6, the first transistor Q11 interposes between the first signal input terminal 18 and the low-voltage power source line 15, while the second transistor Q12 interposes between the second signal input terminal 19 and the low-voltage power source line 15.

Figure 7:
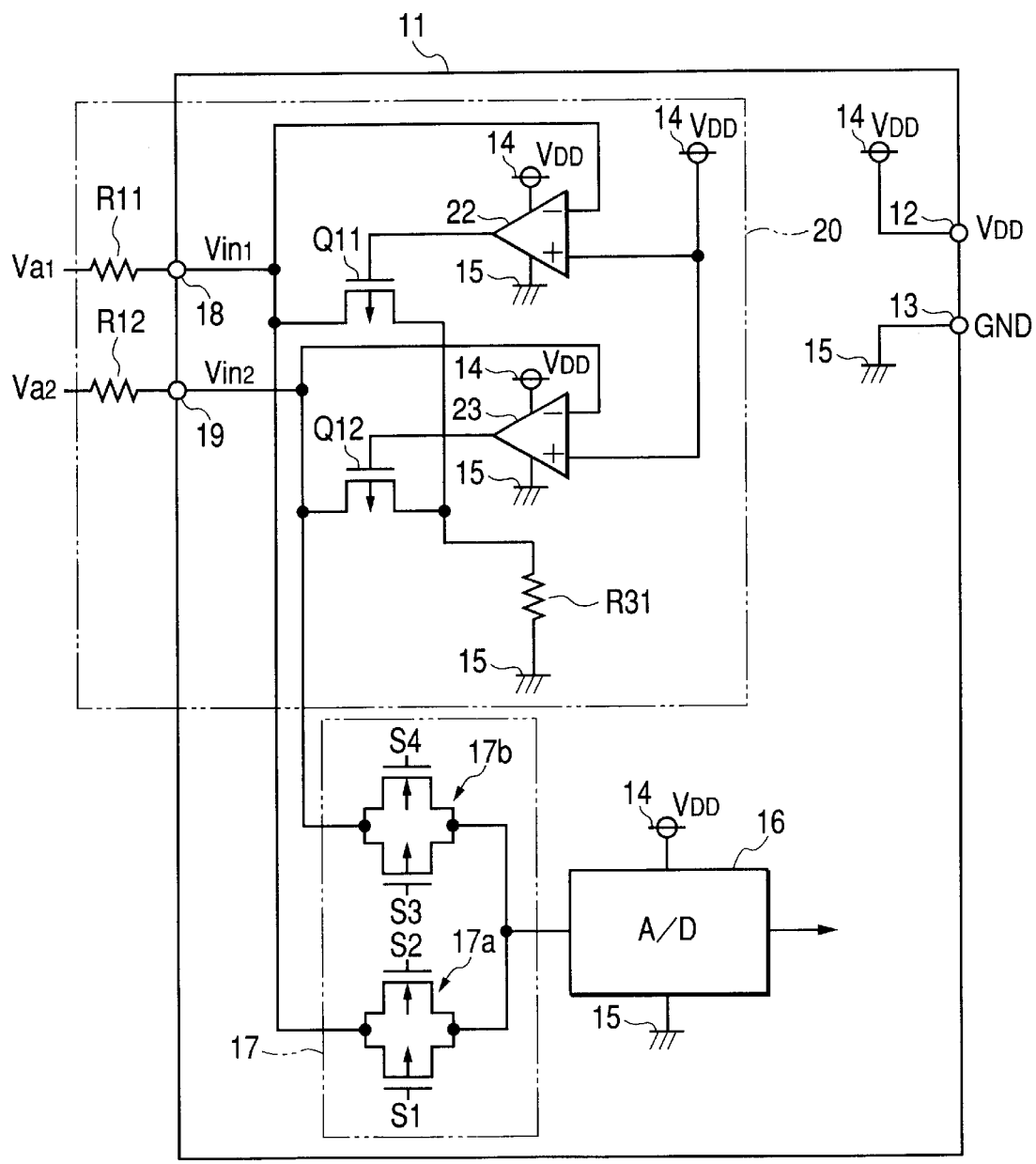
FIG. 7 is a circuit diagram showing the arrangement of another modified semiconductor integrated circuit device in accordance with the first embodiment of the present invention.

According to the circuit arrangement shown in FIG. 7, the first transistor Q11 and a resistor R31 (e.g., current limiting resistor) are serially connected between the first signal input terminal 18 and the low-voltage power source line 15, while the second transistor Q12 and the resistor R31 are serially connected between the second signal input terminal 19 and the low-voltage power source line 15.

In any case shown in FIGS. 6 and 7, the voltage output circuit (constituted with no resistor or with the resistor R31) needs to be designed so as to satisfy the conditions required for the above-described operational amplifier 21.

Similarly, regarding the semiconductor integrated circuit device 25 having a negative overvoltage protection function. The clamp circuit 26 of the second embodiment can be modified as shown in FIGS. 8 and 9.

Figure 8:
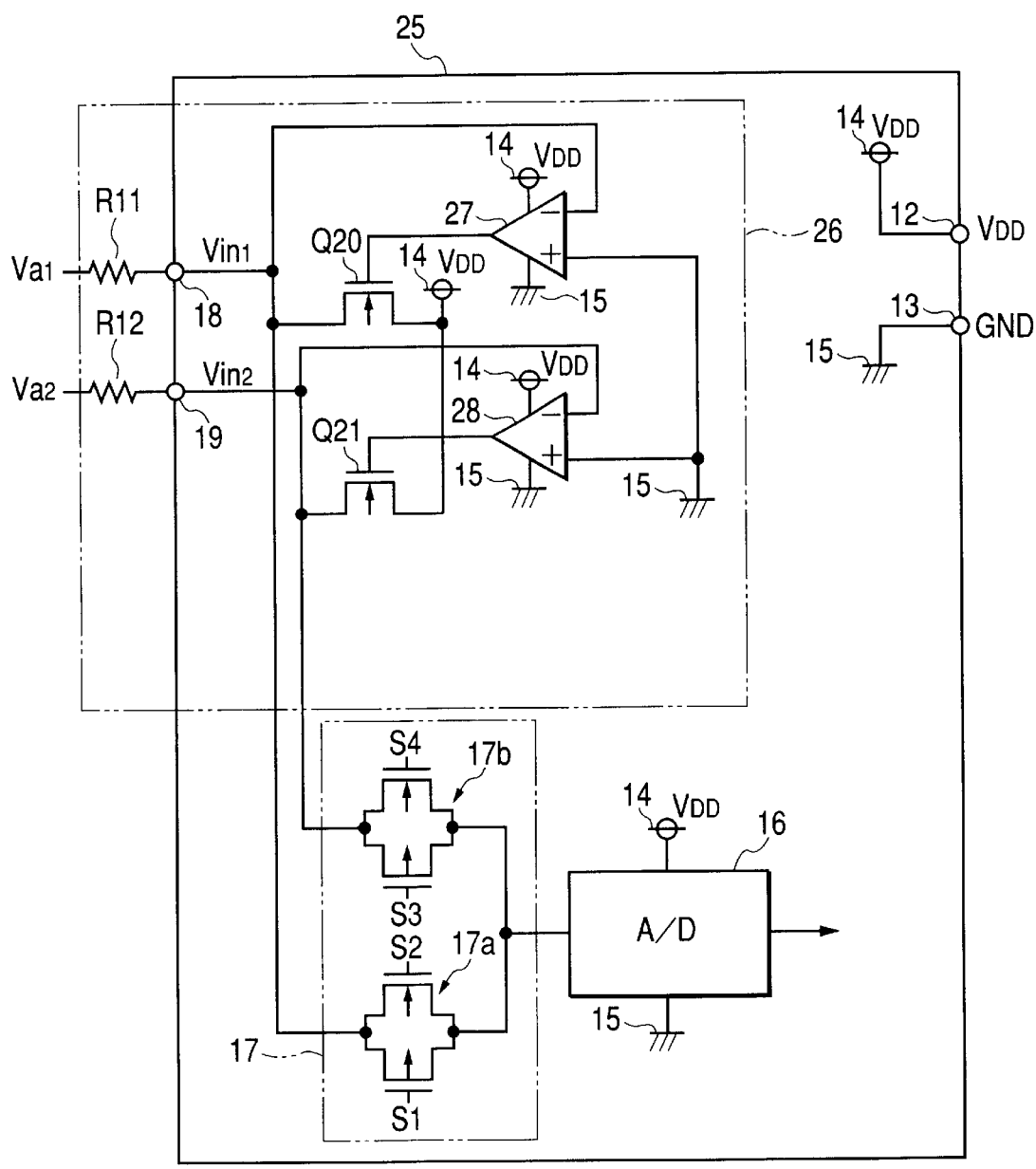
FIG. 8 is a circuit diagram showing the arrangement of a modified semiconductor integrated circuit device in accordance with the second embodiment of the present invention.

According to the circuit arrangement shown in FIG. 8, the transistor Q20 interposes between the first signal input terminal 18 and the high-voltage power source line 14, while the transistor Q21 interposes between the second signal input terminal 19 and the high-voltage power source line 14.

Figure 9:
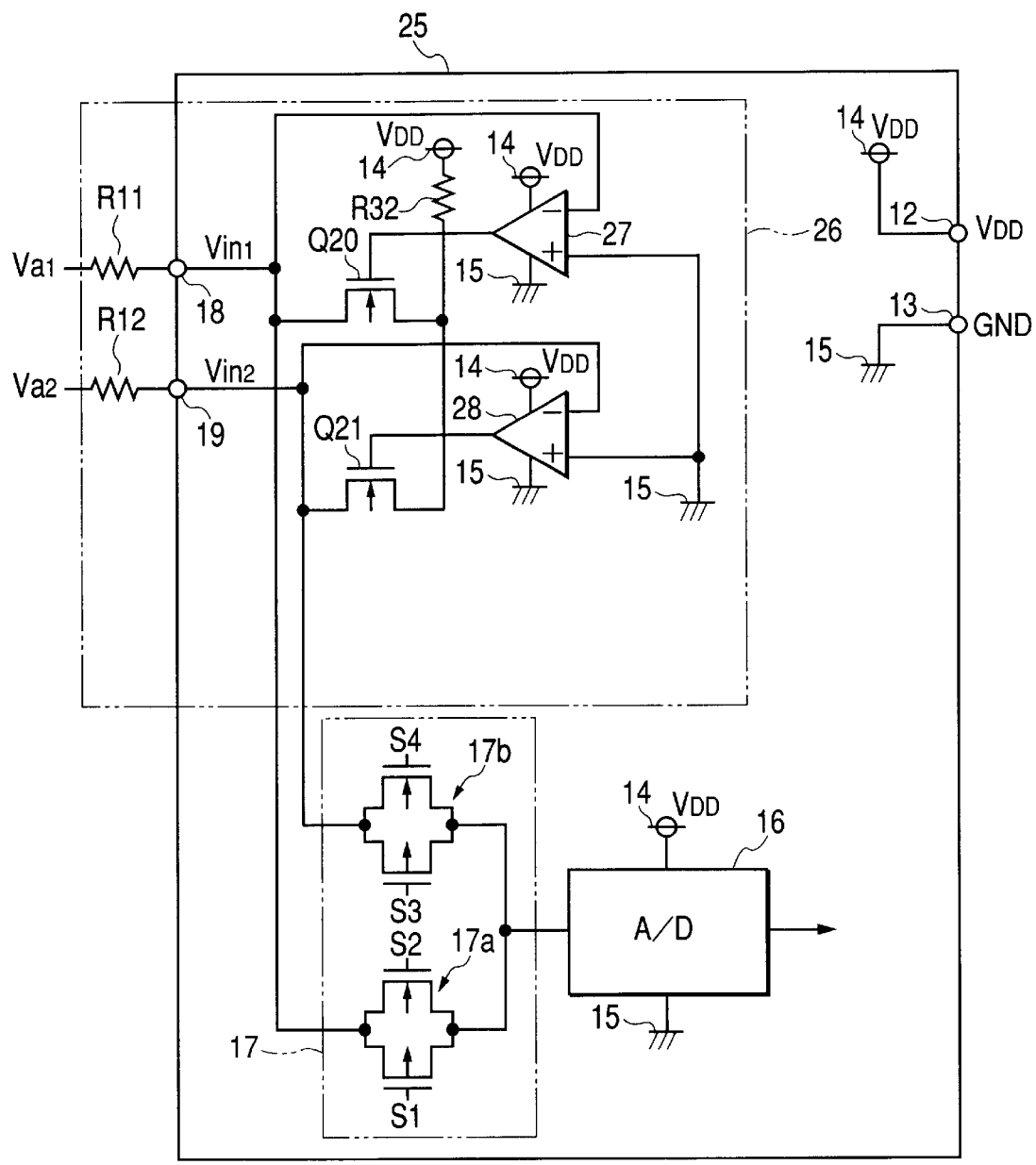
FIG. 9 is a circuit diagram showing the arrangement of another modified semiconductor integrated circuit device in accordance with the second embodiment of the present invention.

According to the circuit arrangement shown in FIG. 9, the transistor Q20 and a resistor R32 (e.g., current limiting resistor) are serially connected between the first signal input terminal 18 and the high-voltage power source line 14, while the transistor Q21 and the resistor R32 are serially connected between the second signal input terminal 19 and the high-voltage power source line 14.

In any case shown in FIGS. 8 and 9, the voltage output circuit (constituted with no resistor or with the resistor R32) needs to be designed so as to satisfy the conditions required for the above-described operational amplifier 21.

In short, the modified embodiments shown in FIGS. 6 to 9 provide a clamp circuit (20, 26) for a semiconductor integrated circuit device (11, 25), comprising a comparing circuit (22, 23, 27, 28) for comparing a voltage (Vin1, Vin2) of a signal input terminal (18, 19) with a predetermined clamp voltage ($V_{CL}$) and for generating a clamp action command signal when the voltage (Vin1, Vin2) of the signal input terminal exceeds the predetermined clamp voltage ($V_{CL}$), and a switching element (Q11, Q12, Q20, Q21) having one end connected to the signal input terminal (18, 19) and the other end connected directly (FIGS. 6 and 8) or via an internal current limiting element (R31, R32, FIGS. 7 and 9) to a power source line (14, 15) for performing a closing operation in response to the clamp action command signal generated from the comparing circuit. The comparing circuit (22, 23, 27, 28), the switching element (Q11, Q12, Q20, Q21), and the internal current limiting element (R31, R32) are provided inside the semiconductor integrated circuit device (11, 25), and an external current limiting element (R11, R12) is provided in a signal input path provided outside the semiconductor integrated circuit device (11, 25) and connected to the signal input terminal (18, 19).

What is claimed is:

1. A clamp circuit comprising:
    a comparing circuit for comparing a voltage of a signal input terminal with a predetermined clamp voltage and for generating a clamp action command signal when said voltage of the signal input terminal exceeds said predetermined clamp voltage;
    a voltage output circuit for generating a voltage within a predetermined range not exceeding said clamp voltage and having a predetermined current output property;
    a switching circuit connected between said signal input terminal and said voltage output circuit for performing a closing operation in response to said clamp action command signal generated from said comparing circuit;
    a semiconductor integrated circuit device incorporating said comparing circuit, said voltage output circuit, and said switching circuit;
    a signal input path provided outside said semiconductor integrated circuit device and connected to said signal input terminal; and
    a current limiting element provided in said signal input path.

2. The clamp circuit in accordance with claim 1, wherein said comparing circuit includes a comparator which operates in response to a predetermined power source voltage supplied from a power source line and has one input terminal connected to said signal input terminal and the other input terminal connected to said power source line, and
    in said comparator, transistors constituting an active load circuit in a differential amplifying circuit have a current output property ratio being set based on a difference between said clamp voltage and said power source voltage.

3. The clamp circuit in accordance with claim 1, wherein said comparing circuit, said switching circuit and said current limiting element are provided for each signal input terminal when said semiconductor integrated circuit device has a plurality of signal input terminals, and said voltage output circuit is commonly provided for said plurality of signal input terminals.

4. The clamp circuit in accordance with claim 1, wherein said current limiting element is a resistor.

5. The clamp circuit in accordance with claim 4, wherein said voltage output circuit has a current output property at least equivalent to $|Vm-V_{CL}|/R \times N$, where Vm represents a maximum voltage of a signal having not passed said resistor, $V_{CL}$ represents said clamp voltage, R represents a resistance value of said resistor, and N represents the total number of signal input terminals.

6. The clamp circuit in accordance with claim 1, wherein said signal input terminal is an analog signal input terminal connected to an A/D converter provided in said semiconductor integrated circuit device.

7. A clamp circuit for a semiconductor integrated circuit device having a positive overvoltage protection function, comprising:
    a comparing circuit for comparing a voltage of a signal input terminal with a predetermined upper clamp voltage and for generating a clamp action command signal when said voltage of the signal input terminal is higher than said predetermined upper clamp voltage;
    a voltage output circuit provided for generating a voltage within a predetermined range not higher than said upper clamp voltage; and
    a switching circuit, connected between said signal input terminal and said voltage output circuit, for performing a closing operation in response to said clamp action command signal generated from said comparing circuit,
    wherein said comparing circuit, said voltage output circuit, and said switching circuit are provided inside said semiconductor integrated circuit device, and
    a current limiting element is provided in a signal input path provided outside said semiconductor integrated circuit device and connected to said signal input terminal.

8. A clamp circuit for a semiconductor integrated circuit device having a negative overvoltage protection function, comprising:
    a comparing circuit for comparing a voltage of a signal input terminal with a predetermined lower clamp voltage and for generating a clamp action command signal when said voltage of the signal input terminal is lower than said predetermined lower clamp voltage;
    a voltage output circuit provided for generating a voltage within a predetermined range not lower than said lower clamp voltage; and
    a switching circuit, connected between said signal input terminal and said voltage output circuit, for performing a closing operation in response to said clamp action command signal generated from said comparing circuit,
    wherein said comparing circuit, said voltage output circuit, and said switching circuit are provided inside said semiconductor integrated circuit device, and
    a current limiting element is provided in a signal input path provided outside said semiconductor integrated circuit device and connected to said signal input terminal.

9. A clamp circuit for a semiconductor integrated circuit device, comprising:
    a comparing circuit for comparing a voltage of a signal input terminal with a predetermined clamp voltage and for generating a clamp action command signal when said voltage of the signal input terminal exceeds said predetermined clamp voltage; and
    a switching element having one end connected to said signal input terminal and the other end directly connected to a power source line for performing a closing operation in response to said clamp action command signal generated from said comparing circuit, wherein said comparing circuit and said switching element are provided inside said semiconductor integrated circuit device, and a current limiting element is provided in a signal input path provided outside said semiconductor integrated circuit device and connected to said signal input terminal.

10. A clamp circuit for a semiconductor integrated circuit device, comprising:

a comparing circuit for comparing a voltage of a signal input terminal with a predetermined clamp voltage and for generating a clamp action command signal when said voltage of the signal input terminal exceeds said predetermined clamp voltage; and a switching element having one end connected to said signal input terminal and the other end connected via an internal current limiting element to a power source line for performing a closing operation in response to said clamp action command signal generated from said comparing circuit, wherein said comparing circuit, said switching element, and said internal current limiting element are provided inside said semiconductor integrated circuit device, and an external current limiting element is provided in a signal input path provided outside said semiconductor integrated circuit device and connected to said signal input terminal.

* * * * *